United States Patent [19]

Stahlhofen

[11] Patent Number: 4,517,275

[45] Date of Patent: May 14, 1985

[54] LIGHT-SENSITIVE MIXTURE BASED ON O-NAPHTHOQUINONE-DIAZIDES, AND LIGHT-SENSITIVE COPYING MATERIAL PREPARED THEREFROM

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 391,005

[22] Filed: Jun. 23, 1982

[30] Foreign Application Priority Data

Jun. 25, 1981 [DE] Fed. Rep. of Germany ....... 3124936

[51] Int. Cl.³ .......................... G03F 7/08; G03C 1/54; C07C 113/00
[52] U.S. Cl. .................................. 430/165; 430/192; 430/193; 430/259; 430/302; 430/308; 430/326; 430/309; 534/557
[58] Field of Search ............... 430/192, 193, 165, 326, 430/302; 260/141 D

[56] References Cited

U.S. PATENT DOCUMENTS

| | | | |
|---|---|---|---|
| 3,046,118 | 7/1962 | Schmidt | 430/193 |
| 3,188,210 | 6/1965 | Fritz et al. | 430/193 |
| 3,647,443 | 3/1972 | Rauner et al. | 430/192 |
| 4,266,001 | 5/1981 | Buhr et al. | 430/192 |
| 4,407,926 | 10/1983 | Stahlhofen | 430/165 |
| 4,409,314 | 10/1983 | Buhr et al. | 430/193 |

FOREIGN PATENT DOCUMENTS 737379 9/1955 United Kingdom .

Primary Examiner—Charles L. Bowers, Jr.
Attorney, Agent, or Firm—Schwartz, Jeffery, Schwaab, Mack, Blumenthal & Koch

[57] ABSTRACT

A light-sensitive mixture is described, which is specially intended for the production of planographic printing plates and which contains, as the light-sensitive compound, a naphthoquinonediazide sulfonic acid ester of the general formula I

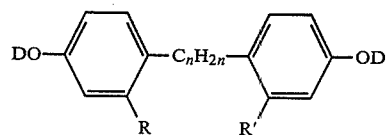

in which D is the 1,2-naphthoquinone-2-diazide-5-sulfonyl radical or the 1,2-naphthoquinone-2-diazide-4-sulfonyl radical, preferably the 1,2-naphthoquinone-2-diazide-5-sulfonyl radical, R and R' are hydrogen atoms, alkyl groups having 1 to 4 carbon atoms or radicals of the formula DO, and n denotes an integer from 6 to 18, preferably from 8 to 14. The new compounds are distinguished by good solubility and produce layers which have a high resistance to alkaline developer solutions and to damping solution containing alcohol.

5 Claims, No Drawings ated are
LIGHT-SENSITIVE MIXTURE BASED ON O-NAPHTHOQUINONE-DIAZIDES, AND LIGHT-SENSITIVE COPYING MATERIAL PREPARED THEREFROM The invention relates to a positive-working light-sensitive mixture which contains, as the light-sensitive compound, a 1,2-naphthoquinone-2-diazide sulfonic acid ester of a bis-hydroxyphenylalkane and which is intended, in particular, for the production of planographic printing plates.

Light-sensitive compounds of the type indicated are known from German Patent No. 872,154. These are 2,2-bis-(4-hydroxyphenyl)-propane or bis-(4-hydroxyphenyl)-methane which are esterified with naphthoquinonediazide sulfonic acids. These compounds exhibit a relatively high sensitivity to light and produce good printing runs, but they have the disadvantage of having too low a solubility for many purposes in the organic solvents which are customarily used for coating printing plates, such as glycol partial ethers or carboxylic acid alkyl esters, such as butyl acetate. Furthermore, in combination with the preferred binders, which are insoluble in water, but soluble in aqueous alkaline solvents, for example novolaks, they produce layers which, in the unexposed state, are insufficiently resistant to the customary alkaline developer solutions. These layers are also attacked to a certain extent during printing in offset printing machines, if fountain solutions containing alcohol are used.

Mixtures containing naphthoquinonediazide sulfonic acid esters of certain bis-phenol derivatives in which two benzene rings are linked via a methylene bridge having aliphatic substitutents are known from German Offenlegungsschrift No. 2,828,037. The solubility of these compounds in organic solvents is high. However, their resistance to alkaline developer solutions and fountain solutions containing alcohol is still not optimum.

It is the object of the invention to provide a light-sensitive, positive-working mixture which contains, as the light-sensitive compound, a novel 1,2-naphthoquinone-2-diazide sulfonic acid ester and which is at least comparable in its technical properties, for printing and copying, with the best mixtures of this type hitherto known, but which has a higher resistance to aqueous alkaline developer solutions and to the fountain solutions, containing alcohol, used in offset printing, has a hard gradation, a high solubility in organic solvents and a good oleophilic character, and can be prepared in a simple manner as a single chemical substance.

The invention relates to a light-sensitive mixture which contains, as the light-sensitive compound, a 1,2-naphthoquinone-2-diazide-4-sulfonic or 1,2-naphthoquinone-2-diazide-5-sulfonic acid ester of a bis-hydroxyphenylalkane.

The mixture according to the invention contains a naphthoquinonediazide sulfonic acid ester which corresponds to the general formula I

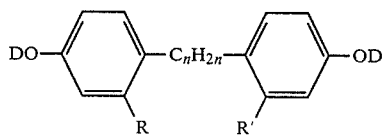

I in which D is the 1,2-naphthoquinone-2-diazide-5-sulfonyl radical or the 1,2-naphthoquinone-2-diazide-4-sulfonyl radical, preferably the 1,2-naphthoquinone-2-diazide-5-sulfonyl radical, R and R' are hydrogen atoms, alkyl groups having 1 to 4 carbon atoms or radicals of the formula DO, and n denotes an integer from 6 to 18, preferably from 8 to 14.

Preferably, at least one of the radicals R and R' is a DO group and, in general, R and R' are preferably identical.

The quinone diazides contained in the mixture according to the invention are novel. They are prepared analogously to known processes by esterifying the phenolic OH groups of the parent polyhydric phenols with o-quinonediazide sulfonic acids or reactive derivatives thereof, for example the sulfonyl chlorides.

The corresponding precursors, for example the polymethylene bisphenols, are prepared by heating long-chain aliphatic diols with 2 moles of the phenol in the presence of dehydrating compounds, such as boron trifluoride or zinc chloride, for 3 to 7 hours at 120° to 170° C. Compounds of this type are described in U. S. Pat. No. 2,321,620 and in J. Am. Chem. Soc. 62 (1940), page 413. The corresponding alkylene bisphenols also can be advantageously obtained by a Clemmensen reduction of the two keto groups of polymethylene diketophenols, which can be prepared by reacting higher paraffin dicarboxylic acids with phenols (Chem. Ber. 74 (1941), page 1,772). 1,1-bis-(4-hydroxyphenyl)-alkanes are prepared by subjecting 2 moles of the phenol to a condensation reaction with 1 mole of a higher aliphatic aldehyde, in the presence of hydrochloric acid. Corresponding compounds are described in J. Am. Chem. Soc. 54 (1932), page 4,325.

The concentration of the novel naphthoquinonediazide sulfonic acid esters in the light-sensitive layer can vary within relatively wide limits. In general, the proportion is 3 to 50, preferably between 7 and 25 percent, based upon the weight of the solids content of the light-sensitive mixture.

The light-sensitive mixtures according to the invention also preferably contain a polymeric, water-insoluble, resin-like binder which is soluble in the solvents used for the mixture according to the invention and which is also soluble, or can at least be swelled, in aqueous alkalies.

The novolak condensation resins which have proved suitable in many positive copying materials based on naphthoquinone diazides also are particularly useful and advantageous as an additive in the mixtures, according to the invention, containing the new naphthoquinonediazide sulfonic acid esters. They promote the strong differentiation between the exposed and unexposed areas of the layer when the layer is developed, which is especially true of the more highly condensed resins containing substituted phenols, for example cresols, as the partner with formaldehyde in the condensation reaction. Other binders which are soluble in alkali or can be swelled in alkali are natural resins, such as shellac and colophony, and synthetic resins, such as copolymers formed from styrene and maleic anhydride or copolymers of acrylic acid or methacrylic acid, particularly with acrylic or methacrylic acid esters.

The nature and amount of the alkali-soluble resin can vary, depending upon the end use; the amount is preferably between 95 and 50, particularly preferably between 90 and 65 percent by weight, based upon the total solids content. In addition, it is also possible to use concomitantly numerous other resins, preferably epoxides and vinyl polymers, such as polyvinyl acetates, polyacrylates, polyvinyl acetals, polyvinyl ethers and polyvinyl pyrrolidone, and the copolymers of the monomers on which the latter are based. The most advantageous proportion of these resins depends upon the requirements of technical performance in use and upon the effect on the conditions of development and, in general, is not more than 20 percent by weight of the alkali soluble resin. For special requirements, such as flexibility, adhesion, gloss, coloration, color change, and the like, the light-sensitive mixture also can contain small quantities of substances such as polyglycols, cellulose derivatives, such as ethylcellulose, wetting agents, dyestuffs, adhesion promoters and finely divided pigments, and, if required, UV absorbers.

The mixtures are generally dissolved in a solvent in order to coat a suitable layer support. The choice of solvents must be such as to suit the coating process envisaged, the layer thickness and the drying conditions. Suitable solvents for the mixture according to the invention are ketones, such as methyl ethyl ketone, chlorinated hydrocarbons, such as trichloroethylene and 1,1,1 trichloroethane, alcohols, such as n-propanol, ethers, such as tetrahydrofuran, alcohol-ethers, such as ethyleneglycol monoethyl ether and esters, such as butyl acetate. It is also possible to use mixtures which additionally can contain, for special purposes, solvents such as acetonitrile, dioxane or dimethylformamide. In principle, it is possible to use any solvent which does not react irreversibly with the components in the layer. Partial ethers of glycols, in particular ethylene glycol monomethyl ether, are particularly preferred.

In most cases, metals are used as layer supports for layer thicknesses below approximately 10 $\mu$m. The following can be employed for offset printing plates: bright-rolled, mechanically or electrochemically roughened and, if appropriate, anodized aluminum which can, additionally, be pretreated chemically, for example with polyvinyl phosphonic acid, silicates, phosphates, hexafluorozirconates or hydrolyzed tetraethyl orthosilicate, and also multi-metal plates composed, for example, of Al/Cu/Cr or of brass/chromium. For the production of relief printing plates, the mixtures according to the invention can be applied to zinc or magnesium plates and to commercially available microcrystalline alloys thereof for single-stage etching processes, and also to etchable plastics, such as polyoxymethylene. The mixtures according to the invention are suitable for gravure printing forms or screen printing forms because of their good adhesion and resistance to etching on copper and nickel surfaces. The mixtures according to the invention also can be used as photoresists in the production of printed circuit boards and in chemical milling. Other supports, such as wood, paper, ceramics, textiles and other metals are also suitable for further applications.

Supports which are preferred for layers which are over 10 $\mu$m thick are plastic films, which are then used as temporary supports for transfer layers. Polyester films, for example films composed of polyethylene terephthalate, are preferred for this purpose and for color test films. Polyolefin films, such as polypropylene, are also suitable, however.

The support material is coated in a known manner by spin-coating, spraying, dipping or application by means of rollers, slot dies or doctor blades or by slot-die coating. Finally, the coating of, for example, printed circuit boards, glass or ceramics and silicon disks also can be effected by transferring a layer from a temporary support. Exposure is carried out using the light sources which are customary in the art. Irradiation with electrons or lasers also constitutes a possible means of forming an image.

The aqueous alkaline solutions of graded alkalinity which are used for developing, which preferably have a pH within the range from 10 to 14 and which also can contain minor quantities of organic solvents or wetting agents, remove the areas of the copying layer which have been affected by light, and thus produce a positive image of the original.

The light-sensitive mixtures according to the invention are preferably used in the production of printing forms, i.e., in particular, offset forms and auto-type relief printing and screen printing forms, and in photoresist compositions and dry resists.

The printing plates which are produced using the new compounds possess a high practical sensitivity to light and also an improved resistance to alkaline developers. The preferred compounds themselves are distinguished by very good solubility in the customary solvents, by a strongly oleophilic character and resistance to alcohol and by good compatibility with the remaining constituents of the copying layer.

The invention is illustrated in greater detail by means of the examples which follow, in which parts by weight and parts by volume are in the same relationship as g to ml. Unless otherwise specified, percentages are percentages by weight.

EXAMPLE 1

An electrolytically roughened and anodized aluminum plate having an oxide layer weighing 3.0 g/m$^2$ was coated with a solution of:

1.10—parts by weight of the esterification product formed from 1 mole of 1,10-bis-(4-hydroxyphenyl)-decane and 2 moles of 1,2-naphthoquinone-2-diazide-5-sulfonyl chloride, 6.10—parts by weight of a cresol/formaldehyde novolak having a softening point of 105°–120° C. as specified in DIN 53,181, 0.12—part by weight of 4-(p-tolylmercapto)-2,5-diethoxybenzenediazonium hexafluorophosphate and 0.06—part by weight of Crystal Violet in 40—parts by weight of ethylene glycol monomethyl ether and 50—parts by weight of tetrahydrofuran.

Before the application of the light-sensitive copying layer, the anodized aluminum support was treated with an aqueous solution of polyvinylphosphonic acid, as described in German Patent No. 1,621,478.

The presensitized material thus prepared, which had a light-sensitive layer weighing 2.00 g/m$^2$, was exposed imagewise under a transparent positive original and was then developed with the following solution:

5.3—parts by weight of sodium metasilicate$\times$9 H$_2$O, 3.4—parts by weight of trisodium phosphate$\times$12 H$_2$O, and 0.3—part by weight of anhydrous sodium dihydrogen phosphate in 91.0—parts by weight of water.

As a result of being developed, the portions of the copying layer which had been affected by light were removed, leaving the unexposed areas of the image on the layer support. About 200,000 satisfactory prints were produced in an offset machine from the printing form thus prepared. The printing stencil was distinguished by an excellent oleophilic character, resistance to alcohol and adhesion to the support.

Additional coating solutions by means of which similar results were obtained are indicated in the Examples which follow. Unless otherwise noted, the preparation and processing of the printing plates contained in these Examples corresponds to the conditions described in Example 1.

EXAMPLE 2

An electrolytically roughened and anodized aluminum plate, which had been subjected to after-treatment with an aqueous solution of polyvinylphosphonic acid, was coated with a solution of:

1.00—part by weight of the esterification product formed from 1 mole of 1,10-bis-(2,4-dihydroxyphenyl)-decane and 4 moles of 1,2-naphthoquinone-2-diazide-5-sulfonyl chloride, 5.70—parts by weight of the novolak indicated in Example 1, 0.12—parts by weight of 1,2-naphthoquinone-2-diazide-4-sulfonyl chloride, and 0.07—part by weight of Crystal Violet in 30—parts by weight of ethylene glycol monomethyl ether, 40—parts by weight of tetrahydrofuran, and 10—parts by weight of butyl acetate.

EXAMPLE 3

An electrolytically roughened and anodized aluminum plate was coated with a solution of:

1.20—parts by weight of the esterification product formed from 1 mole of 1,1-bis-(4-hydroxy-2-methylphenyl)-dodecane and 2 moles of 1,2-naphthoquinone-2-diazide-5-sulfonyl chloride, 6.20—parts of the novolak indicated in Example 1, 0.13—part by weight of 4-(p-tolylmercapto)-2,5-diethoxy-benzenediazonium hexafluorophosphate, and 0.07—part by weight of Crystal Violet in 40—parts by weight of ethylene glycol monomethyl ether, and 50—parts by weight of tetrahydrofuran.

EXAMPLE 4

An electrolytically roughened and anodized aluminum plate which had been subjected to after-treatment with an aqueous solution of polyvinyl phosphonic acid, was coated with a solution of:

1.10—parts by weight of the esterification product formed from 1 mole of 1,12-bis-(4-hydroxy-2-methylphenyl)-dodecane aNd 2 moles of 1,2-naphthoquinone-2-diazide-5-sulfonyl chloride, 6.10—parts by weight of the novolak indicated in Example 1, 0.08—parts by weight of 2,3,4-trihydroxybenzophenone, 0.20—parts by weight of a polyvinylbutyral containing 69 to 71 percent of vinylbutyral units, 24 to 27 percent of vinyl alcohol units and 1 percent of vinyl acetate units, and 0.07—parts by weight of Crystal Violet in 30—parts by weight of ethylene glycol monomethyl ether, 40—parts by weight of tetrahydrofuran, and 10—parts by weight of butyl acetate.

It will be obvious to those skilled in the art that many modifications may be made within the scope of the present invention without departing from the spirit thereof, and the invention includes all such modifications.

What I claim is:

1. A light-sensitive mixture which contains a binder which is insoluble in water, but soluble or at least swellable in aqueous alkaline solutions, and as the light-sensitive compound, a 1,2-naphthoquinone-2-diazide-4-sulfonic or 1,2-naphthoquinone-2-diazide-5-sulfonic acid ester of a bis-hydroxy-phenylalkane, wherein the naphthoquinonediazide sulfonic acid ester corresponds to the general formula I

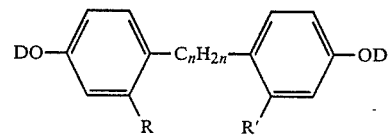

in which D is the 1,2-naphthoquinone-2-diazide-5-sulfonyl radical or the 1,2-naphthoquinone-2-diazide-4-sulfonyl radical, R and R' are hydrogen atoms, alkyl groups having 1 to 4 carbon atoms or radicals of the formula DO, and n denotes an integer from 10 to 18.

2. A light-sensitive mixture as claimed in claim 1 which contains 3 to 50 percent by weight of a naphthoquinonediazide sulfonic acid ester, based upon its content of non-volatile constituents.

3. A light-sensitive mixture as claimed in claim 1 which contains a compound of the formula I in which at least one of the radicals R and R' is a DO radical.

4. A light-sensitive copying material composed of a layer support and a light-sensitive layer containing a binder which is insoluble in water, but soluble or at least swellable in aqueous alkaline solutions, and a 1,2-naphthoquinone-2-diazide sulfonic acid ester of a bis-hydroxyphenylalkane, wherein the naphthoquinonediazide sulfonic acid ester corresponds to the general formula I

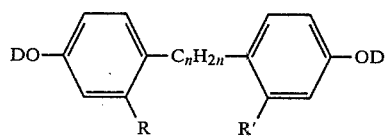

in which D is the 1,2-naphthoquinone-2-diazide-5-sulfonyl radical or the 1,2-naphthoquinone-2-diazide-4-sulfonyl radical, R and R' are hydrogen atoms, alkyl groups having 1 to 4 carbon atoms or radicals of the formula DO, and n denotes an integer from 10 to 18.

5. A light-sensitive copying material as claimed in claim 4 wherein the layer support is composed of aluminum.

* * * * *